US008308866B2

(12) United States Patent
Negishi

(10) Patent No.: US 8,308,866 B2
(45) Date of Patent: Nov. 13, 2012

(54) VAPOR DEPOSITION APPARATUS FOR AN ORGANIC VAPOR DEPOSITION MATERIAL AND A METHOD FOR PRODUCING AN ORGANIC FILM

(75) Inventor: Toshio Negishi, Chigasaki (JP)

(73) Assignee: ULVAC, Inc., Chigasaki-shi (JP)

( * ) Notice: Subject to any disclaimer, the term of this patent is extended or adjusted under 35 U.S.C. 154(b) by 1049 days.

(21) Appl. No.: 12/212,030

(22) Filed: Sep. 17, 2008

(65) Prior Publication Data

US 2009/0061090 A1    Mar. 5, 2009

Related U.S. Application Data

(63) Continuation of application No. PCT/JP2007/059723, filed on May 11, 2007.

(30) Foreign Application Priority Data

May 19, 2006  (JP) .................................. 2006-140793

(51) Int. Cl.
*C23C 16/00* (2006.01)

(52) U.S. Cl. ......................... 118/719; 118/726; 118/727

(58) Field of Classification Search .................. 118/726, 118/718, 719, 727; 373/10–17
See application file for complete search history.

(56) References Cited

U.S. PATENT DOCUMENTS

| | | | | |
|---|---|---|---|---|
| 3,554,512 A * | 1/1971 | Elliott et al. | ................... | 432/233 |
| 3,563,202 A * | 2/1971 | Mackrael et al. | .............. | 118/718 |
| 4,984,952 A * | 1/1991 | Reuter | ............................ | 414/180 |
| 6,551,405 B1 * | 4/2003 | Thibado et al. | ................ | 118/726 |
| 7,922,821 B2 * | 4/2011 | Soininen | ........................ | 118/726 |
| 8,123,862 B2 * | 2/2012 | Ohara | ............................ | 118/727 |
| 2002/0017245 A1 * | 2/2002 | Tsubaki et al. | ................ | 118/718 |
| 2004/0255857 A1 | 12/2004 | Chow et al. | | |
| 2006/0062915 A1 | 3/2006 | Long et al. | | |
| 2006/0062920 A1 | 3/2006 | Long et al. | | |

FOREIGN PATENT DOCUMENTS

| | | |
|---|---|---|
| CN | 1535329 A | 10/2004 |
| JP | 10-204624 | 8/1998 |
| JP | 11-200014 | 7/1999 |

(Continued)

OTHER PUBLICATIONS

International Search Report for International Application No. PCT/JP2007/059723 dated May 28, 2007.
Office Action dated Mar. 15, 2010 issued in corresponding counterpart Chinese Application No. 200780001375.8.
Office Action dated Nov. 9, 2010 issued in corresponding Japanese Application No. 2007-540847.

(Continued)

*Primary Examiner* — Karla Moore
(74) *Attorney, Agent, or Firm* — Kratz, Quintos & Hanson, LLP

(57) ABSTRACT

A vapor deposition apparatus is provided, which does not cause changes in composition, decomposition and quality change of an organic vapor deposition material. The organic vapor deposition material is placed on a conveying unit by an amount for a single substrate, and conveyed into a vapor deposition vessel preliminarily heated. Since a small amount of the organic vapor deposition material is heated and exhausted through generation of an organic material vapor under heating condition for each substrate, neither decomposition nor quality change with moisture occurs because heating time is short. Even though different organic compounds are mixed, no change in composition occurs so that an organic vapor deposition material in which a base material is mixed with a coloring substance can be pooled in a pooling tank and then placed in the conveying unit.

5 Claims, 7 Drawing Sheets

| FOREIGN PATENT DOCUMENTS | | | |
|---|---|---|---|
| JP | 2000223269 A | * | 8/2000 |
| JP | 2002-249868 | | 9/2002 |
| JP | 2003-160856 A1 | | 6/2003 |
| JP | 2003-293120 | | 10/2003 |

OTHER PUBLICATIONS

Supplementary European Search Report dated Jun. 26, 2012, in counterpart European Application No. 07743158.3.

* cited by examiner

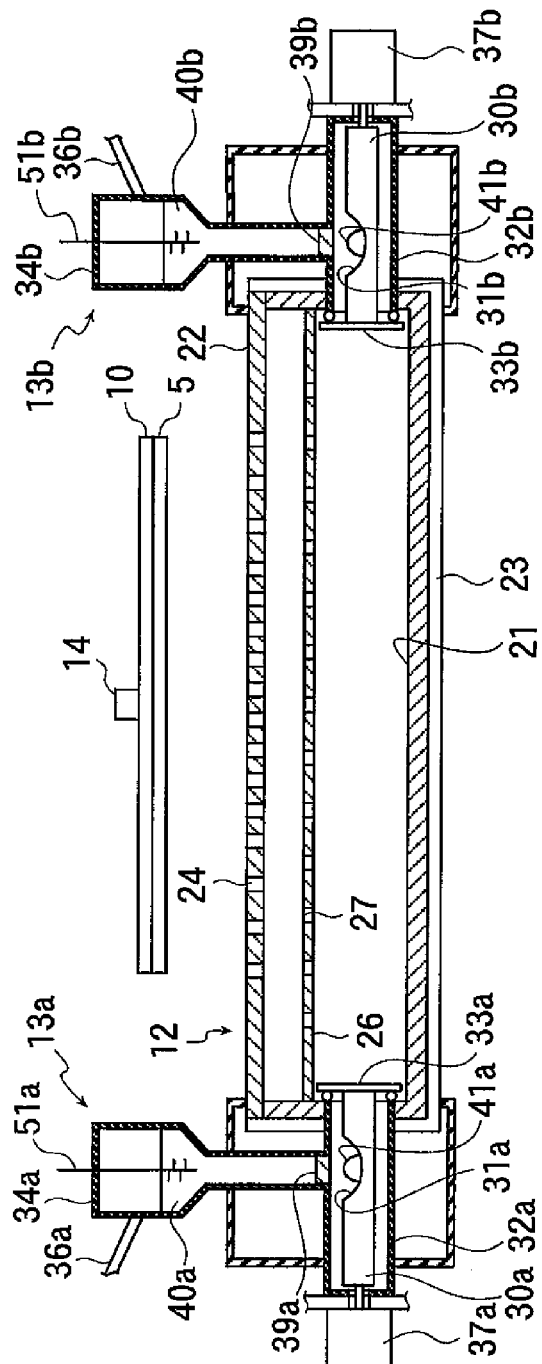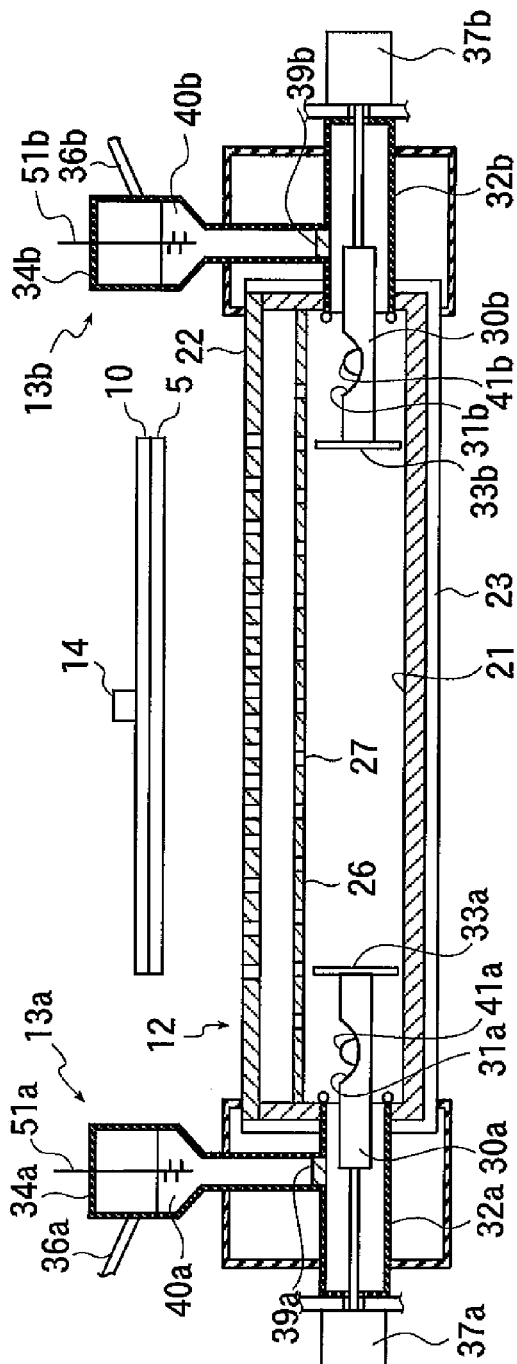
Fig. 3 (a)
Fig. 3 (b)

60

VAPOR DEPOSITION APPARATUS FOR AN ORGANIC VAPOR DEPOSITION MATERIAL AND A METHOD FOR PRODUCING AN ORGANIC FILM

The present invention is a Continuation of International Application No. PCT/JP2007/059723 filed May 11, 2007, which claims priority to Japan Patent Document No. 2006-140793, filed on May 19, 2006. The entire disclosures of the prior applications are hereby incorporated by reference herein in their entireties.

BACKGROUND

The present invention generally relates to a technical field of the organic films. Particularly, the invention relates to the technology for producing organic films having high quality.

The organic EL device is one of the most recently notable display elements, and has excellent features of high brightness and high response speed. The organic EL device includes light-emitting areas, which emit lights in three different colors of red, green and blue, and are arranged on a glass substrate. In the light-emitting area, an anode electrode film, a hole injection layer, a hole transporting layer, a light emitting layer, an electron transporting layer, an electron injection layer and a cathode electrode film are laminated in this order. Coloring substances added into the light emitting layers develop a red, green or blue color.

Reference numeral 203 in FIG. 8 denotes a conventional organic film-forming apparatus in which a vapor deposition vessel 212 is disposed inside a vacuum chamber 211. The vapor deposition vessel 212 includes a vessel body 221 of which an upper portion thereof is covered with a lid 222 having one or plural discharge openings 224 formed therein.

A powdery organic vapor deposition material 200 is placed inside the vapor deposition vessel 212.

A heater 223 is arranged at a side face and a bottom face of the vapor deposition vessel 212. When the interior of the vacuum chamber 211 is evacuated and the heater 223 generates heat, the temperature of the vacuum deposition vessel 212 rises to heat the organic vapor deposition material 200 inside the vacuum deposition vessel 212.

When the organic vapor deposition material 200 is heated to the vapor deposition temperature or higher, a vapor of the organic material fills the vapor deposition vessel 212, and is discharged into the vacuum chamber 211 through the discharge openings 224.

A substrate conveyer 214 is arranged above the discharge openings 224. When the substrate 205 is held by a holder 210 and the substrate conveyer 214 is operated, the substrate 205 passes immediately above the discharge openings 224, and the vapor of the organic material discharged through the discharge opening 224 reaches the surface of the substrate 205, thereby forming an organic film (such as, a hole injection layer, a hole transporting layer or the like).

When the substrates 205 are passed through above the discharge openings 224 one by one in the state that the vapor of the organic material is being discharged, organic films can be formed successively on a plurality of the substrates 205.

The vacuum vessel as mentioned above is described in, for example, JP-A 2003-293120.

SUMMARY OF THE INVENTION

However, in order to form films on a plurality of the substrate 205 as mentioned above, a considerable amount of the organic vapor deposition material 200 needs to be placed inside the vapor deposition vessel 212. When heating is started and the films are formed on the plural substrates 205, the organic vapor deposition material 200 remaining in the vapor deposition vessel 212 has been exposed at a high temperature for a long time, so that the material changed in quality through a reaction with water inside vapor deposition vessel or its decomposition was advanced by heating. Thus, as compared to the state in the initial heating stage, the organic vapor deposition material 200 is deteriorated.

FIG. 7 is a graph schematically showing the deteriorated state in which the abscissa axis denotes the time, and the ordinate axis denotes the molecular weight of the vapor of the organic material discharged through the discharge openings 224, the molecular weight immediately after heating being at 100%.

Additionally, when films are formed in a state where an organic vapor deposition material, in which an organic compound as a base material for constituting a light-emitting layer is mixed with an organic compound as a coloring substance, is placed inside the vapor deposition vessel 212, the contained proportions change from those in the heating initial stage after the films are formed on the plural substrates 205 because the vapor of the compound having a lower evaporating temperature is likely to be discharged. The contained proportions of the base material and the coloring substance in the organic material vapor largely differ between the heating initial stage and after the formation of the films on the plural substrates 205.

Therefore, it was necessary in the conventional vapor deposition apparatuses to separately set a base material-evaporating vessel and a coloring substance-evaporating vessel in the same vacuum chamber.

In order to solve the above problems, the present invention is directed to a vapor deposition apparatus having a vacuum chamber, a vacuum deposition vessel arranged inside the vacuum chamber, a feeding unit in which a vapor deposition material is placed, a loading chamber connected to the vapor deposition vessel and the feeding unit, a conveying unit configured to be movable between an interior of the loading chamber and that of the vacuum chamber and the vapor deposition material is fed from the feeding unit when the conveying unit is located inside the loading chamber, and a heating unit configured to heat the vapor deposition vessel, in order to emit a material vapor from the vapor deposition material located inside the vapor deposition vessel and to discharge the material vapor into the vacuum chamber through a discharge opening of the vapor deposition vessel.

Further, the present invention is directed to the vapor deposition apparatus in which the feeding unit comprises a pooling tank for pooling the vapor deposition material and a connecting unit that connects the interior of the pooling tank to that of the loading chamber so as to transfer the vapor deposition material inside the pooling tank into the loading chamber.

Furthermore, the present invention is directed to the vapor deposition apparatus in which the pooling tank is disposed above the loading chamber such that when the interior of the pooling tank is connected to that of the loading chamber, the vapor deposition material inside the pooling tank drops in order to be placed on the conveying unit inside the loading chamber.

In addition, the present invention is directed to the vapor deposition apparatus which includes a separating plate to separate an interior ambience of the loading chamber from that of the vapor deposition vessel.

Moreover, the present invention is directed to the vapor deposition apparatus which includes a conveying mechanism arranged inside the vacuum chamber, the conveying mechanism being configured to hold an object to be film-formed and pass the object through a position opposed to the discharge opening.

Further, the present invention is directed to a method for producing an organic film, including placing an organic vapor deposition material in a vapor deposition vessel set inside a vacuum chamber, heating the vapor deposition vessel so as to discharge an organic material vapor of the organic vapor deposition material through a discharge opening of the vapor deposition vessel, successively transferring a plurality of objects to be film-formed through a position opposed to the discharge opening so as to form organic films on the objects to be film-formed, wherein after the organic vapor deposition material is placed inside the vapor deposition vessel and the organic material vapor is started to be emitted and the formation of the organic film onto the object to be film-formed is initiated, the organic vapor deposition material is fed into the vapor deposition chamber in the state that the vapor deposition vessel is set inside the vacuum chamber.

Furthermore, the present invention is directed to the organic film-producing method in which the organic vapor deposition material is fed to the vapor deposition vessel for each object to be film-formed.

Still further, the present invention is directed to the organic film-producing method in which the organic vapor deposition material to be fed into the vapor deposition vessel is stored in a vacuum ambience at a temperature lower than the evaporation temperature of the organic vapor deposition material.

Still further, the present invention is directed to the organic film-producing method in which the organic vapor deposition material is fed in a powdery form.

Still further, the present invention is directed to the organic film-producing method in which different kinds of organic compounds are mixed in the powdery organic vapor deposition material, which is fed to the vapor deposition vessel.

Still further, the present invention is directed to the organic film-producing method in which the organic vapor deposition material is a tablet obtained by compacting a powder. Furthermore, the present invention relates to the organic film-producing method in which different kinds of organic compounds are mixed in the powder of the organic vapor deposition material to be formed into the tablet.

Since the organic vapor deposition material is not exposed to high temperatures for a long time, the material is not decomposed or changed in quality.

Further, when the organic vapor deposition material is fed into the vapor deposition vessel for each substrate, the mixed proportions do not vary for the respective substrates even if the different organic compounds are mixed in the organic vapor deposition material.

BRIEF DESCRIPTION OF THE DRAWINGS

FIGS. 3(a) and 3(b) show a process chart for illustrating a procedure of producing an organic film by using the vapor deposition apparatus according to the present invention.

DETAILED DESCRIPTION OF THE EMBODIMENTS

The present invention will be explained in reference to the drawings.

Figure 1:
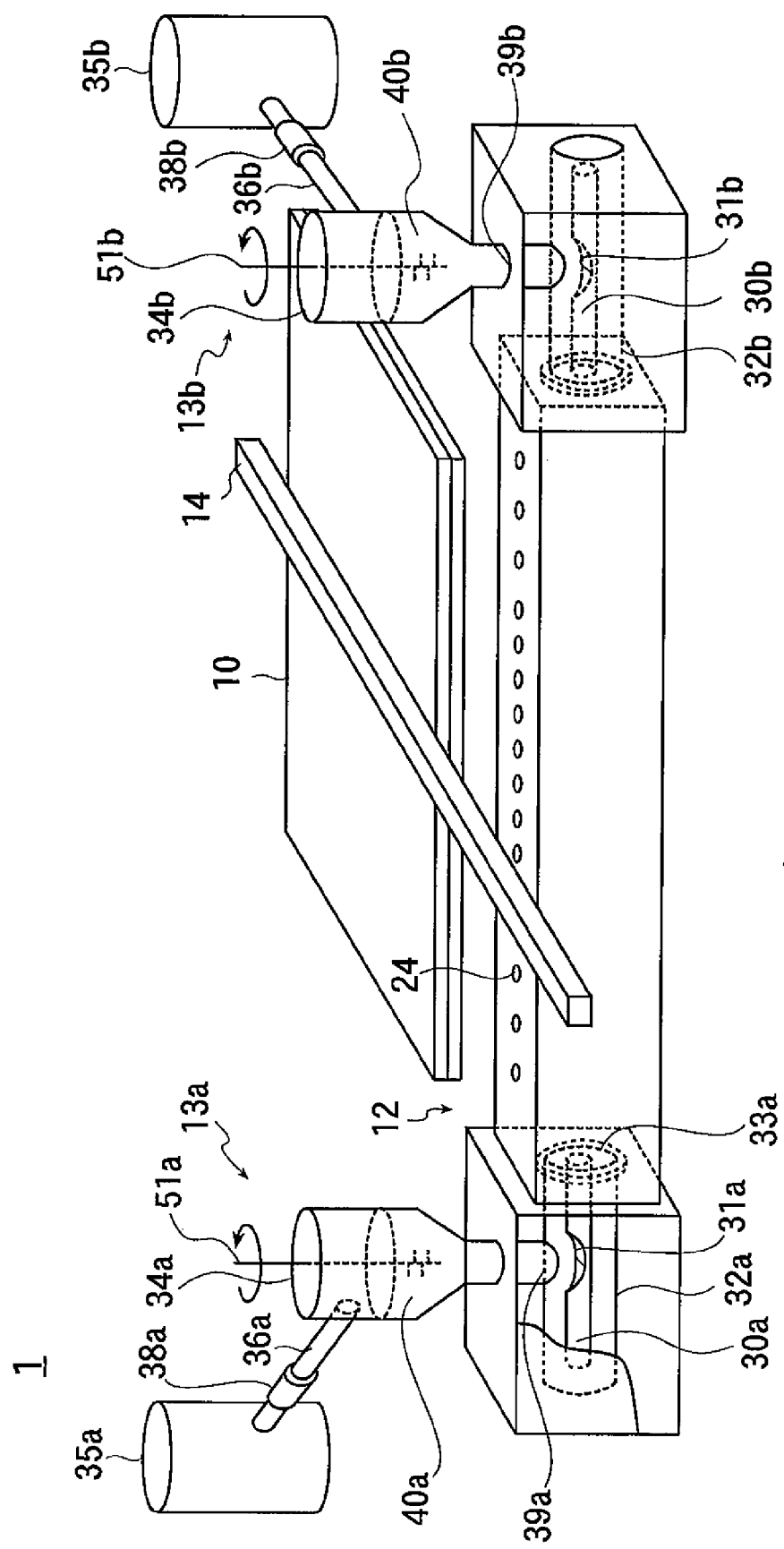
FIG. 1 is a perspective view for illustrating a first embodiment of the vapor deposition apparatus according to the present invention.
Figure 2:
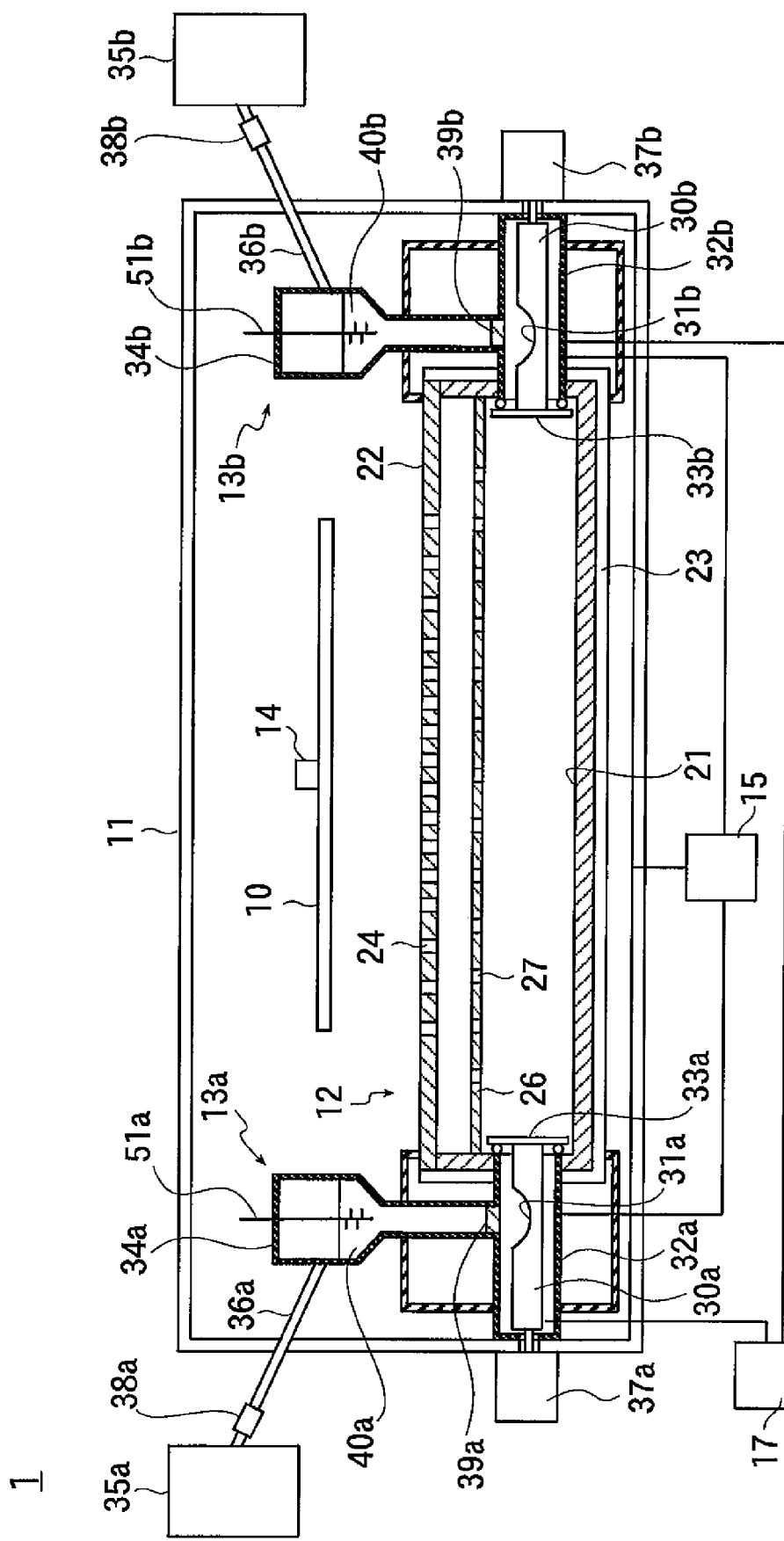
FIG. 2 is a schematically sectional view for illustrating an interior of the vapor deposition apparatus of the present invention.

Reference numeral 1 in the perspective view of FIG. 1 and the schematically sectional view of FIG. 2 refers to a first embodiment of the vapor deposition apparatus for producing the organic film as one example of the present invention.

This vapor deposition apparatus 1 includes a vacuum chamber 11, a vapor deposition vessel 12 and one or plural feeding units 13a, 13b. In FIG. 1, the vacuum chamber 11 is omitted.

The vapor deposition vessel 12 is set inside the vacuum chamber 11.

The vacuum deposition vessel 12 includes a long and narrow vessel body 21 and a long and narrow planar lid portion 22. The vessel body 21 is closed with the lid portion 22.

One or plural loading chambers 32a, 32b are connected to the vapor deposition vessel 12. Here, there are two loading chambers 32a and 32b, which are disposed at opposite ends in the longitudinal direction of the vessel body 21, respectively.

Openings are formed at a part of side walls (the side walls at the opposite ends in the longitudinal direction) of the vessel body 21 and a part of the loading chambers 32a and 32b, and the openings of the vessel body 21 are communicated with those of the loading chambers 32a and 32b, whereby the interior of the vessel body 21 is connected to the interior of the loading chambers 32a and 32b.

The feeding units 13a and 13b include the loading chambers 32a and 32b, pooling tanks 34 and 34b, and the connecting units 39a and 39b, respectively.

The interiors of the pooling tanks 34a and 34b are connectable to those of the loading chambers 32a and 32b through the connecting units 39a and 39b.

The pooling tanks 34a and 34b are arranged above the loading chambers 32a and 32b.

The connecting units 39a and 39b are constructed such that when they are in closed state, they shut off the bottom portions of the pooling tanks 34a and 34b to shield the interiors of the pooling tanks 34a and 34b from those of the loading chambers 32a and 32b; whereas, when they are opened, the connecting units connect the interiors of the pooling tanks 34a and 34b to those of the loading chambers 32a and 32b. The bottom portions of the pooling tanks 34a and 34b are closed in the state that the connecting units 39a and 39b are closed, so that an organic vapor deposition material 40a and 40b having flowability (such as, a powder or liquid) can be pooled inside the pooling tanks 34a and 34b. Here, the organic vapor deposition materials 40a and 40b are powder.

Opening and closing of the connecting units 39a and 39b and the amounts of the organic vapor deposition materials 40a and 40b passing through the connecting units 39a and 39b are controlled by a controller (such as, a computer). When the connecting units 39a and 39b are set in an open state, the organic vapor deposition materials 40a and 40b fall due to their own weights so that the materials 40a and 40b pass through the connecting units 39a and 39b, and move from the pooling tanks 34a and 34b into the loading chambers 32a and 32b.

At this time, the organic vapor deposition materials 40a and 40b pass through the connecting units 39a and 39b only by amounts specified by the controller. After such movement, the connecting units 39a and 39b are closed. The organic vapor deposition materials 40a and 40b to be fed may be fed by a constant weight or alternatively fed by a constant volume.

Conveying units (boats) 30a and 30b are arranged inside the loading chambers 32a and 32b, respectively. Receiver portions 31a and 31b are formed in upper portions of the conveying units 30a and 30b, respectively. Here, the receiver portions 31a and 31b are concaves formed in the conveying units 30a and 30b, but they may be constructed by receiving trays which are placed on the conveying units 30a and 30b.

The receiver portions 31a and 31b are directed vertically upwardly, and positioned under connecting portions between the loading chambers 32a and 32b and the pooling tanks 34a and 34b. The organic vapor deposition materials fall inside the loading chambers 32a and 32b drop and are placed onto the receiver portions 31a and 31b.

Moving mechanisms 37a and 37b are connected to the conveying units 30a and 30b; and when the moving mechanisms 37a and 37b extend rods, the conveying units 30a and 30b are moved into the vapor deposition vessel 12 from the interior of the loading chambers 32a and 32b. On the other hand, when the rods are drawn, the conveying units 30a and 30b move into the loading chambers 32a and 32b from the interior of the vapor deposition vessel 12.

Inside the vapor deposition vessel 12, a planar filling plate 26 is placed in parallel to the lid 22. The conveying units 30a and 30b moved into the vapor deposition vessel 12 are located between the filling plate 26 and the bottom face of the vessel body 21.

A heating unit 23 is arranged outside the bottom face and the side faces of the vessel body 21. The heating unit 23 is provided with a resistance heat generator which generates heat upon applying current. When the heating unit 23 generates heat, the vessel body 21, the filling plate 26 and the lid 22 are heated to increase their temperatures. The vessel body 21, the filling plate 26 and the lid 22 are made of a material having high heat conductivity (such as, carbon graphite or a metal).

The heating unit 23 widely includes units for heating the vapor deposition vessel 12 (for heating, for example, not only the resistance heat generator but also a unit for heating the vapor deposition vessel 12 by electromagnetic induction), a unit for heating the vapor deposition vessel 12 by infrared radiations, a unit for heating the vapor deposition vessel 12 by heat conduction of a heated heat medium, and a unit for heating by a Peltier effect.

As discussed later, the interior of the vacuum chamber 11 including those of the vapor deposition vessel 12 and the loading chambers 32a and 32b are preliminarily set to vacuum ambience, and the conveying units 30a and 30b located inside the vapor deposition vessel 12 are heated upon receipt of radiant heat emitted from the vessel body 21 and the radiant heat reflected from the filling plate 26 so that the organic vapor deposition material placed in the receiver portions 31a and 31b are heated.

When the organic vapor deposition material is heated to a temperature not less than the vapor-generating temperature, the organic material vapor is emitted from the organic vapor deposition material.

The lid portion 22 and the filling plate 26 are formed with one or plural discharge openings 24 and 27, respectively. The emitted organic material vapor flows out into the space between the filling plate 26 and the lid portion 22, while filling the space between the filling plate 26 and the bottom face of the vessel body 21 inside the vapor deposition vessel 12. Thus, the vapor is discharged into the vacuum chamber 11 through the discharge openings 24, while filling the former space. The organic material vapor does not leak out through a portion other than the discharge openings 24 of the vacuum deposition vessel 12.

The relative positions between the discharge openings 24 of the lid portion 22 and the discharge openings 27 of the filling plate 26 are adjusted such that the organic material vapor may be filled at an almost constant concentration in the space between the filling plate 26 and the lid portion 22, while an almost identical discharge amount of the organic material vapor may be discharged through every discharge opening 24 of the lid portion 22.

A substrate-conveying mechanism 14 is arranged inside the vacuum chamber 11. A holder 10 is attached to the substrate-conveying mechanism 14. When the substrate to be film-formed is held by the holder 10 and is moved inside the vacuum chamber 11, the substrate passes through a position opposed to the discharge openings 24 of the lid portion 22.

The discharge openings 24 and 27 are arranged along the longitudinal direction of the lid portion 22 and the filling plate 26; and the substrate moves in a direction orthogonal to the longitudinal direction of the lid portion 22. The width of the substrate is smaller than the length of an area where the discharge openings 27 are arranged; and the organic material vapor discharged inside the vacuum chamber 11 through the discharge openings 24 uniformly reaches the surface of the substrate, thereby forming an organic film.

Next, steps of successively forming organic films on plural objects (substrates) to be film-formed by using the first embodiment of the vapor deposition apparatus 1 according to the present invention will be explained.

A vacuum evacuation system 15 is connected to the vacuum chamber 11, the loading chambers 32a and 32b and the pooling tanks 34a and 34b, respectively. When the vacuum evacuation system 15 is operated, the vacuum chamber 11, the loading chambers 32a and 32b and the pooling tanks 34a and 34b are evacuated. The gas inside the evaporation deposition vessel 12 is evacuated through the vacuum chamber 11 by the vacuum evacuation.

Each of the chambers 11, 32a and 32b and the tanks 34a and 34b may be evacuated by the same vacuum evacuating system 15, or may be provided with an individual vacuum evacuating system.

The pooling tanks 34a and 34b may be configured to be evacuated through the interiors of the loading chambers 32a and 33b.

After the interiors of the vacuum chamber 11, the vacuum deposition vessel 12, the loading chambers 32a and 32b and the pooling tanks 34a and 34b are evacuated to a vacuum ambience of around an identical vacuum degree, and current is applied to the heating unit 23 so as to generate heat, thereby heating the vapor deposition vessel 12.

The conveying units 30a and 30b are arranged inside the loading chambers 32a and 32b so that even if the heater 23 generates heat, the conveying units are not heated.

The organic vapor deposition materials 40a and 40b are preliminarily placed in the pooling tanks 34a and 34b; and the organic vapor deposition materials 40a and 40b inside the pooling tanks 34a and 34b are dropped by the predetermined amounts through opening of the connecting units 39a and

39*b*, thereby placing the materials on the receiver portions 31*a* and 31*b* of the conveying units 30*a* and 30*b*.

Figure 4:
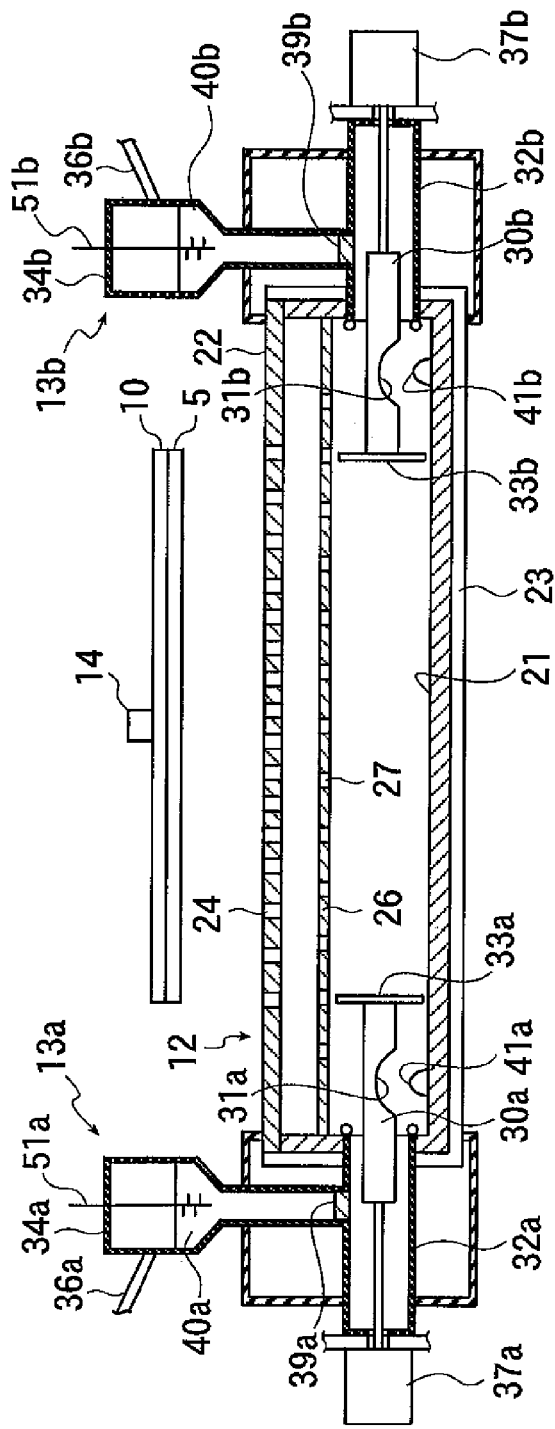
FIGS. 4(a) and 4(b) show a process chart for illustrating a procedure of placing an organic vapor deposition material onto a bottom face of a vapor deposition vessel.
Figure 4:
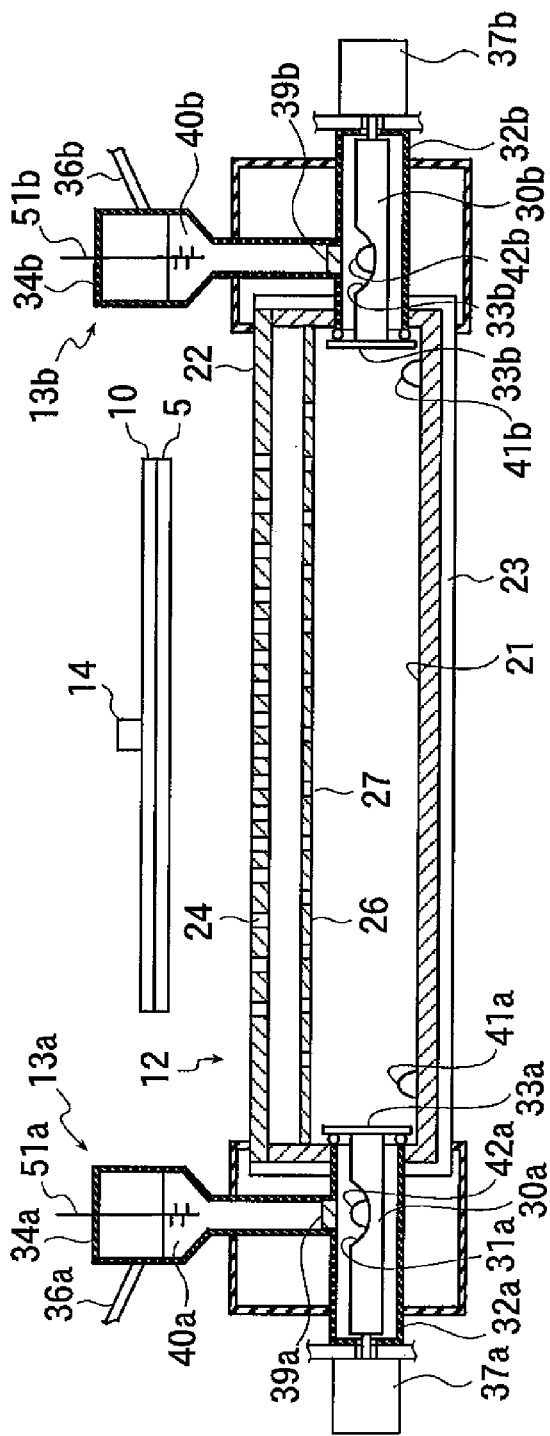

Reference numerals 41*a* and 41*b* of FIG. 3(*a*) denote the organic vapor deposition materials placed on the receiver portions 31*a* and 31*b*. (In FIGS. 3 and 4, the vacuum chamber 11 and storage tanks 35*a* and 35*b* as described later are omitted.) The object 5 to be film-formed is supported by the holder 10 such that a surface to be film-formed is opposed to the discharge openings 24.

Before the substrate 5 reaches the vapor deposition vessel 12, as shown in FIG. 3(*b*), the conveying units 30*a* and 30*b* are moved into the vapor deposition vessel 12 in state such that the organic vapor deposition materials 41*a* and 41*b* are placed on them. Since the heat capacity of the conveying units 30*a* and 30*b* is small, the organic vapor deposition materials 41*a* and 41*b* on the conveying units 30*a* and 30*b* are heated up to the evaporating temperature in a short time by the radiant heat emitted from the vapor deposition vessel 12 including the vessel body 21 and so on, thereby emitting the organic material vapor. When the substrate 5 reaches the vacuum deposition vessel 12 of which the organic material vapor is discharged and passes through the position opposed to the discharge openings 24 of the lid portion 22, an organic film is formed on the surface of the substrate 5.

Here, plural substrates 5 pass through the position opposed to the discharge openings 24 of the vapor deposition vessel 12 one by one.

As the organic vapor deposition material 41*a* and 41*b* gradually lessen as the organic material vapor is emitted. The amounts of the organic vapor deposition materials 41*a* and 41*b* placed on the conveying units 30*a* and 30*b* are set to such amounts that the materials are not exhausted before the substrates pass but disappear immediately after the passage. Before succeeding substrates reach the vapor deposition vessel 12 after the exhaustion of the materials, the conveying units 30*a* and 30*b* are returned into the loading chambers 32*a*, 32*b*, and the organic vapor deposition materials are refilled onto the conveying units 30*a* and 30*b* as mentioned below.

Sealing plates 33*a* and 33*b* are disposed at ends of the conveying units 30*a* and 30*b* on the side of the vacuum deposition vessel 12.

The sealing plates 33*a* and 33*h* have a diameter larger than that of opened portions through which the interiors of the conveying units 30*a* and 30*b* are connected to those of the loading chambers 32*a* and 32*b*; and O-rings are placed around the opened portion or around the edges of the sealing plates 33*a* and 33*b*.

The sealing plates 33*a* and 33*b* are closely fitted to the vessel body 21 via the O-rings in such a state that the conveying units 30*a* and 30*b* are received inside the loading chambers 32*a* and 32*b* so that the interiors of the loading chambers 32*a* and 32*b* are shielded from that of the vacuum deposition vessel 12.

A gas feeding system 17 is connected to the loading chambers 32*a* and 32*b*; and a cooling gas (inert gas such as a rare gas including argon gas or nitrogen gas) is introduced into the loading chambers 32*a* and 32*b* so that the conveying units 30*a* and 30*b* are cooled to be temperatures lower than the vapor generating temperature by the heat conduction of the gas. The cooling gas introduced into the loading chambers 32*a* and 32*b* does not enter the vapor deposition vessel 12 in such a state that the interiors of the loading chambers 32*a* and 32*b* are shielded from that of the vapor deposition vessel 12 by the sealing plates 33*a* and 33*b*.

Since the loading chambers 32*a* and 32*b* are almost at room temperature and the heat capacity of the conveying units 30*a* and 30*b* is small, the temperature of the conveying units 30*a* and 30*b* are easily lowered through the radiant heat emitted by the conveying units 30*a* and 30*b*.

Therefore, the temperature of the conveying units 30*a* and 30*b* can be decreased to a temperature lower than the vaporizing temperature by spontaneous cooling without introduction of the cooling gas. In this case, the cooling time becomes longer as compared to a case in which the cooling gas is used.

When the conveying units 30*a* and 30*b* are cooled down to a given temperature, the feeding of the gas is stopped. Then, after the interiors of the loading chambers 32*a* and 32*b* are evacuated to a pressure identical to the pressure of the vapor deposition vessel 12 and the pooling tanks 34*a* and 34*b*, the connecting units 39*a* and 39*b* are opened to drop given amounts of the organic vapor deposition materials from the pooling tanks 34*a* and 34*b* in order to place them on the conveying units 30*a* and 30*b*.

Then, after the conveying units 30*a* and 30*b* are moved into the vapor deposition vessel 12 in the same manner as in the above step, and the temperature is raised to emit the organic material vapor; consequently, a succeeding substrate is passed through the position opposed to the discharge openings 24, thereby forming an organic film thereon.

The surrounding areas of the pooling tanks 34*a* and 34*b* are at room temperature; and the organic vapor deposition materials 40*a* and 40*b* placed therein are kept also at room temperature. Further, the interiors of the pooling tanks 34*a* and 34*b* are evacuated.

Therefore, the organic vapor deposition materials 40*a* and 40*b* placed in the pooling tanks 34*a* and 34*b* are stored at room temperature in a vacuum ambience, and their oxidation or decomposition does not proceed. Thus, the organic vapor deposition materials 40*a* and 40*b* that are not deteriorated are fed to the conveying units 30*a* and 30*b*.

Further, the organic vapor deposition material is heated only during a time period when it is positioned in the vapor deposition vessel 12. Such time period is a time period during which the substrates 5 pass, and the heated time period is short so that the deterioration of the material inside the vapor deposition vessel 12 is very small. In the pooling tanks 34*a* and 34*b* and the below-mentioned storage tanks 35*a* and 35*b*, there is no deterioration. Therefore, the vapor of organic compounds as produced by decomposition or deterioration is not discharged into the vacuum deposition chamber 11.

In the organic vapor deposition materials 40*a* and 40*b* pooled in the pooling tanks 34*a* and 34*b*, a powder of an organic compound constituting a base material of a light emitting layer of an organic EL device and a powder of an organic compound as a coloring substance of the light emitting layer are mixed at a given ratio so that the organic light-emitting layer can be formed on the surface of the substrate 5 even if a vapor deposition vessel for the base material and that for the coloring substance are not separately set inside the vacuum chamber 11.

Since the powdery organic compound for the base material and that for the coloring substance are uniformly mixed and the time period from the start to the finish of the formation of the light-emitting layer (organic film) onto the surface of a single substrate is short, there is a small change in the content proportions of the vapor of the organic compound for the base material and that for the coloring substance in the organic material vapor discharged into the vacuum chamber 11. The light-emitting layer having the same composition is formed onto the substrate 5 even if the content of proportion changes because the organic vapor deposition materials 41*a* and 41*b* are newly fed and placed into the vacuum deposition vessel 12 for each of the substrate 5.

In the above embodiment, the organic material vapor is emitted in a state in which the organic vapor deposition materials 41a and 41b are placed on the conveying units 30a and 30b. However, after the conveying units 30a and 30b having the organic vapor deposition materials 41a and 41b placed thereon are inserted into the vacuum deposition vessel 12, the conveying units 30a and 30b can be turned upside down by rotation or the like as shown in FIG. 4(a) in order to direct the receiver portions 31a and 31b vertically downwardly and drop the organic vapor deposition materials 41a and 41b from the receiver portions 31a and 31b onto the bottom face of the vapor deposition vessel 12. The organic vapor deposition materials 41a and 41b can be heated by the heat conduction through the vapor deposition vessel 12 in addition to the radiant heat.

When the organic vapor deposition materials 41a and 41b placed on the bottom face of the vapor deposition vessel 12 are heated to the evaporation temperature or higher, the organic material vapor is discharged through the discharge openings 24 of the lid portion 22, and an organic film is formed on the surface of the substrate 5 passing through the position opposed to the discharge openings 24.

If the conveying units 30a and 30b are returned into the loading chambers 32a and 32b after the organic vapor deposition materials 41a and 41b are dropped and the conveying units 30a and 30b are put back in the loading chambers 32a and 32b during the generation of the vapor, the conveying units 30a and 30b are not heated. Thus, if before or after the conveying units 30a and 30b are put back in the loading chambers 32a and 32b, the conveying units 30a and 30b turned upside down are returned to the original state in order to direct the receiver portions 31a and 31b vertically upward while the receiver portions 31a and 31b are placed on the positions where the organic vapor deposition material drops inside the loading chambers 32a and 32b from the pooling tanks 34a and 34b, fresh organic vapor deposition materials can be placed onto the conveying units 30a and 30b without being cooled.

According to the above-discussed vapor deposition apparatus 2, as shown in FIG. 4(b) fresh organic vapor deposition materials 42a and 42b can be placed onto the conveying units 30a and 30b, while a film is being formed on the surface of the substrate using the organic vapor deposition materials 41a and 41b disposed on the bottom face of the vessel body 21. Consequently, the interval between the preceding substrate 5 and the succeeding substrate 5 can be shortened.

Receiver trays can be arranged at the bottom face of the vessel body 21 where the organic vapor deposition materials 41a and 41b drop.

In the above-discussed vapor deposition apparatuses 1 and 2, if given amounts of the organic vapor deposition materials are dropped from the pooling tanks 34a and 34b into the loading chambers 32a and 32b for each of the passing substrates, the amounts of the organic vapor deposition materials 40a and 40b pooled in the pooling tanks 34a and 34b are decreased.

As shown in FIGS. 1 and 2, the storage tanks 35a and 35b are connected to the pooling tanks 34a and 34b via transfer pipes 36a and 36b. The organic vapor deposition material is stored inside the storage tanks 35a and 35b.

The transfer pipes 36a and 36b are provided with on-off valves 38a and 38b.

When the inside of the pooling tanks 34a and 34b are at vacuum ambience while the interiors of the storage tanks 35a and 35b are exposed to the atmospheric pressures the on-off valves 38a and 38b are closed so that the atmosphere may not enter the pooling tanks 34a and 34b from the storage tanks 35a and 35b.

When the amounts of the organic vapor deposition materials inside the pooling tanks 34a and 34b decrease, the interiors of the storage tanks 35a and 35b are evacuated. After the pressures inside the storage tanks 35a and 35b are lowered to the same level as the pressures in the pooling tanks 34a and 34b, the on-off valves 38a and 38b are opened so that the organic vapor deposition materials inside the storage tanks 35a and 35b are transferred into the pooling tanks 34a and 34b through the transfer pipes 38a and 36b.

After the organic vapor deposition materials inside the pooling tanks 34a and 34b increase to reach given amounts, the on-off valves 38a and 38b are closed to disconnect the interiors of the pooling tanks 34a and 34b from those of the storage tanks 35a and 35b. In this state, the organic vapor deposition materials can be conveyed into the storage tanks 35a and 35b, while their interiors are exposed to the atmosphere.

The pooling tanks 34a and 34b are equipped with stirrers 51a and 51b. When the organic vapor deposition materials 40a and 40b are fed from the pooling tanks 34a and 34b to the conveying units 30a and 30b, the materials are stirred with the stirrers 51a and 51b in order not to form voids in the organic vapor deposition materials 40a and 40b inside the pooling tanks 34a and 34b.

The organic vapor deposition materials may be stirred with the stirrers 51a and 51b when the materials are fed from the storage tanks 35a and 35b into the pooling tanks 34a and 34b.

When the interiors of the pooling tanks 34a and 34b are disconnected from those of the loading chambers 32a and 32b by the connecting units 39a and 39b or other valves, the atmosphere can be introduced into the pooling tanks 34a and 34b in a state such that the interiors of the loading chambers 32a and 32b are kept in the vacuum ambience. In this case, while the interiors of the pooling tanks 34a and 34b are exposed to the atmosphere in a state such that the interiors of the loading chambers 32a and 32b are closed from those of the pooling tanks 34a and 34b, the organic vapor deposition materials can be transferred into the pooling tanks 34a and 34b.

In that case, if the interiors of the pooling tanks 34a and 34b are evacuated before the organic vapor deposition materials 40a and 40b inside the pooling tanks 34a and 34b are fed into the loading chambers 32a and 32b, no atmosphere enters the loading chambers 32a and 32b.

The above-described vapor deposition apparatus 1 is constructed such that the discharge openings 24 are provided in the upper portion of the vapor deposition vessel 12, and the substrate passes above the vapor deposition vessel 12, while that surface of the substrate 5 to be film-formed is directed vertically downwardly. However, the present invention is not limited to such a vapor deposition apparatus 1. For example, the discharge openings may be arranged in the vertical direction, and the film-forming surface of the substrate is vertically set.

Figure 5:
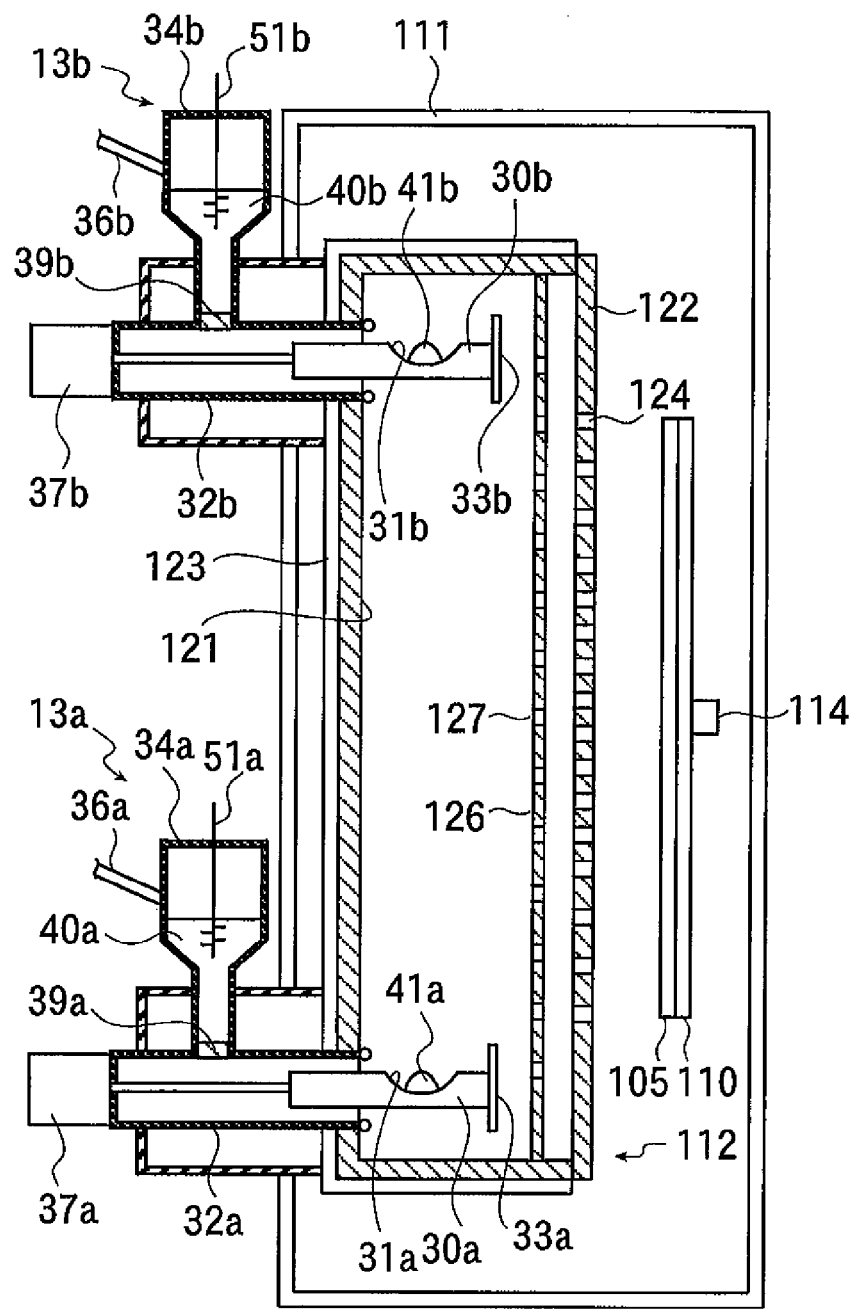
FIG. 5 is a schematically sectional view for illustrating a second embodiment of the vapor deposition apparatus according to the present invention.

A reference numeral 2 of FIG. 5 denotes a second embodiment of the present invention directed to such an invention of a vapor deposition apparatus. In the second embodiment of the vapor deposition apparatus 2, an elongated vapor deposition vessel 112 is arranged inside a vacuum chamber 111. The vapor deposition vessel 112 includes an elongated vessel body 121 and a planar lid portion 122.

The vessel body 121 is set, while its longitudinal direction is vertical so that openings face lateral direction.

The opening of the vessel body 121 is closed with the lid portion 122 vertically placed. One or plural discharge openings 124 are arrayed in the lid portion 122 along the longitudinal direction. The longitudinal direction of the lid portion 122 is vertical so the discharge openings 124 are also arrayed vertically.

An elongated filling plate 126 is vertically disposed inside the vapor deposition vessel 112 in parallel to the lid portion 122, while the longitudinal direction of the elongated filling plate 126 is vertically arranged. One or plural discharge openings 127 are arrayed in this filling plate 126 along the longitudinal direction.

A substrate conveying mechanism 114 is provided inside the vacuum chamber 111. A holder 110 is attached to the substrate conveying mechanism 114 so that a substrate 105 to be film-formed passes through a position opposed to the discharge openings 124 of the lid portion 122 in which the substrate is vertically held by the holder 110.

The second embodiment of the vapor deposition apparatus 2 is provided with the same feeding units 13a and 13b as in the first apparatus 1. The same reference numerals are used in reference to the same members in the feeding units 13a and 13b, and their explanation is thus not repeated.

In this vapor deposition vessel 112, the bottom face constitutes one side wall thereof, and one or plural feeding units 13a and 13b are vertically disposed at that one side wall of the vapor deposition vessel 112 which is the bottom face of the vessel body 121.

In this embodiment, two feeding units 13a and 13b are disposed, one and the other being arranged at upper and lower end sides of the vapor deposition vessel 112, respectively.

Openings are formed in parts of the bottom face of the vessel body 121 (at positions near the upper and lower ends thereof) and parts of the loading chambers 32a and 32b, and the openings of the vessel body 121 are communicated with those of the loading chambers 32a and 32b so that the interior of the vessel body 121 is connected to those of the loading chambers 32a and 32b.

The conveying units 30a and 30b arranged inside the loading chambers 32a and 32b are configured to be inserted between the bottom face of the vessel body 121 and the filling plate 126 inside the vessel body 121.

The vessel body 121 is heated by a heating unit 123.

The interiors of the pooling tanks 34a and 34b can be connected to those of the loading chambers 32a and 32b via the connecting units 39a and 39b. The connecting units 39a and 39b are opened in order to put a specified amount of the organic vapor deposition material 41a and 41b on the receiver portions 31a and 31b of the conveying units 31a and 31b; and the conveying units 31a and 31b are inserted into the inside of the vapor deposition vessel 112 in such a manner that the organic vapor deposition material is placed, then the organic vapor deposition material 41a and 41b are heated to the evaporating temperature or higher in a short time by the radiant heat of the vapor deposition vessel 112 including the vessel body 121, etc.; consequently, the organic material vapor is generated from the organic vapor deposition material 41a and 41b placed on the conveying unit 31a and 31b. Accordingly, the organic material vapor is emitted from the organic vapor deposition materials 41a and 41b on the conveying units 30a and 30b.

When the substrate 105 vertically set by the substrate conveying unit 114 is passed through the position where its film-forming surface is being opposed to the discharge openings 124 while the organic material vapor is filled inside the vapor deposition vessel 112 and discharged uniformly from the discharge openings 124 of the lid portion 122, an organic film is formed on the surface of the substrate 105.

After the substrates 105 passes, the organic vapor deposition materials 41a and 41b on the receiver portions 31a and 31b disappear through evaporation.

Following the disappearance, the conveying units 30a and 30b are returned into the loading chambers 32a and 32b. After the conveying units 30a and 30b are cooled down to the temperature lower than the vapor generating temperature by a cooling gas or cooled spontaneously, specified amounts of the organic vapor deposition materials are dropped onto the receiver portions 31a and 31b of the conveying units 30a and 30b from the pooling tanks 34a and 34b, and an organic film is formed on a surface of another substrate in the same manner as in the above steps.

In the first and second vapor deposition apparatuses 1 and 2, the powdery or liquid organic vapor deposition materials 40a and 40b having flowability are dropped and placed onto the conveying units 30a and 30b from the pooling tanks 34a and 34b. However, the present invention is not limited to instances where the organic vapor deposition materials are transferred or moved by dropping. Material-conveying units can be provided between the pooling tanks 34a and 34b and the loading chambers 32a and 32b, and the organic vapor deposition materials 40a and 40b are transferred, horizontally or obliquely through the vacuum ambience in order to place on the loading chambers 34a and 34b from the interiors of the pooling tanks 34a and 34b without being dropped.

Figure 6:
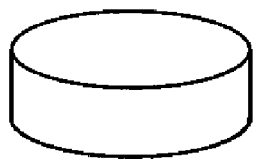
FIG. 6 is a perspective view for illustrating a tablet-shaped organic vapor deposition material that can be used in the present invention.
Figure 7:
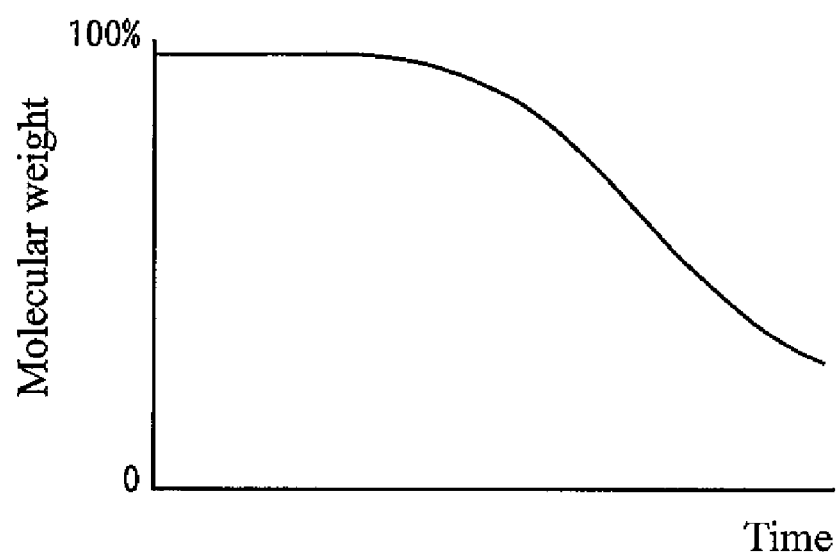
FIG. 7 is a graph showing deterioration of the organic material vapor discharged into the vacuum chamber of the conventional vapor deposition apparatus.
Figure 8:
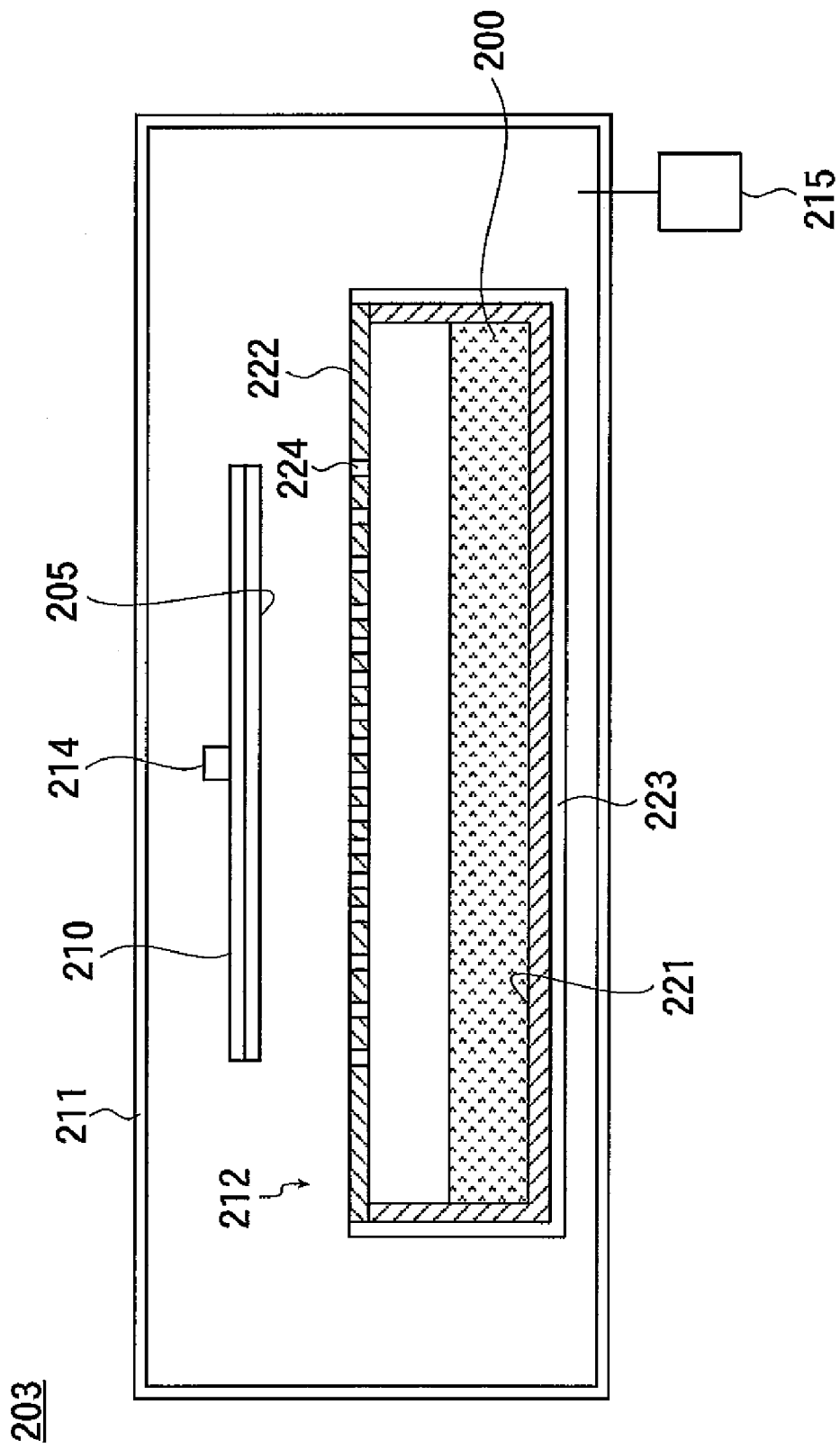
FIG. 8 is the conventional vapor deposition apparatus.

In this case, the organic vapor deposition material may have no flowability. For example, as shown in FIG. 6, it may be that a tablet-shaped organic vapor deposition material 60 is obtained by tableting the powder through compacting or the like, and fed to the conveying units 30a and 30b.

In this case, if the amount of the tablet of the organic vapor deposition material 60 is set equal to that of the organic film to be formed on a surface of a single substrate or set to one of plurally divided portions of that amount, the organic film can be formed by feeding one or plural tablets of the organic vapor deposition material 60 into the vapor deposition vessel 12 for each substrate.

In this tablet-shaped organic vapor deposition material 60 can also be incorporated different organic compounds (such as, an organic compound as a base material and an organic compound as a coloring substance), while being uniformly dispersed at given mixing proportions.

Explanation has been made above for uses of the powdery organic vapor deposition materials 41a and 41b and the tablet-shaped organic vapor deposition material 60 in which two or more different kinds (two kinds in the embodiments) of the organic compounds such as the organic compound for the base material and the organic compound for the coloring substance while being mixed at the given mixing proportions. An organic vapor deposition material made of one kind of an organic compound may be placed in the vapor deposition vessel 12, 112 to emit an organic material vapor.

Further, the different compounds are not limited to the base material and the coloring substance.

Further, the organic films are formed by the vapor deposition apparatus according to the present invention in the above-mentioned embodiments. The present invention is suitable for the producing method of successively forming the films on a plurality of the objects to be film-formed by evaporating the vapor deposition material in the vacuum ambience which would be deteriorated if heated for a long period. The vapor deposition material that emits the vapor inside the vapor deposition vessel is not limited to the organic compound. In fact, the vapor deposition apparatus according to the present invention can be used not only for forming the films of the organic compound but also for forming inorganic films or films of composite materials.

What is claimed:

1. A vapor deposition apparatus comprising:
   a vacuum chamber;
   a vacuum deposition vessel arranged inside the vacuum chamber, the vacuum deposition vessel having a plurality of discharge openings;
   a feeding unit in which a vapor deposition material is placed;
   a loading chamber connected to the vacuum deposition vessel and the feeding unit;
   a conveying unit configured to be movable between an interior of the loading chamber and that of the vacuum deposition vessel, the vapor deposition material being fed on the conveying unit from the feeding unit when the conveying unit is located inside the loading chamber, and the conveying unit conveying the vapor deposition material inside the vacuum deposition vessel;
   a heating unit configured to heat the vacuum deposition vessel in order to emit a material vapor from the vapor deposition material located inside the vacuum deposition vessel and to discharge the material vapor into the vacuum chamber through the plurality of discharge openings,
   wherein when the conveying unit is located inside the loading chamber, an interior of the loading chamber is shielded from an interior of the vacuum deposition vessel.

2. The vapor deposition apparatus according to claim 1, wherein the feeding unit comprises a pooling tank for pooling the vapor deposition material and a connecting unit that connects the interior of the pooling tank to that of the loading chamber so as to transfer the vapor deposition material inside the pooling tank into the loading chamber.

3. The vapor deposition apparatus according to claim 2, wherein the pooling tank is disposed above the loading chamber such that when the interior of the pooling tank is connected to that of the loading chamber, the vapor deposition material inside the pooling tank drops in order to place on the conveying unit inside the loading chamber.

4. The vapor deposition apparatus according to claim 1, further comprising a separating plate to separate an interior ambience of the loading chamber from that of the vacuum deposition vessel.

5. The vapor deposition apparatus according to claim 1, further comprising a conveying mechanism arranged inside the vacuum chamber,
   wherein the conveying mechanism holds an object to be film-formed and pass the object through a position opposed to the plurality of discharge openings.

* * * * *